United States Patent [19]

Higaki

[11] Patent Number: 5,236,854
[45] Date of Patent: Aug. 17, 1993

[54] COMPOUND SEMICONDUCTOR DEVICE AND METHOD FOR FABRICATION THEREOF

[76] Inventor: Yukio Higaki, c/o Mitsubishi Denki Kabushiki Kaisha, Optoelectronic and Microwave Devices, R&D Laboratory, No. 1., Mizuhara 4-chome, Itami-shi, Hyogo-ken, Japan

[21] Appl. No.: 813,479

[22] Filed: Dec. 26, 1991

Related U.S. Application Data

[62] Division of Ser. No. 623,202, Dec. 6, 1990, abandoned.

[30] Foreign Application Priority Data

Dec. 11, 1989 [JP] Japan .................. 1-322303

[51] Int. Cl.[5] .................. H01L 29/161
[52] U.S. Cl. .................. 437/44; 257/24; 437/974; 437/958; 437/927; 437/203
[58] Field of Search .................. 437/44; 148/53; 257/24

[56] References Cited

U.S. PATENT DOCUMENTS

| | | | |
|---|---|---|---|
| 3,969,745 | 7/1976 | Blocker | 357/22 |
| 4,456,888 | 6/1984 | Ayasli | 357/22 |
| 4,507,845 | 4/1985 | McIver et al. | 357/91 |
| 4,537,654 | 8/1985 | Berenz et al. | 357/22 K |
| 4,868,613 | 9/1989 | Hirachi | 357/55 |
| 4,893,155 | 1/1990 | Ohata | 357/55 |
| 4,935,789 | 6/1990 | Calvielle | 357/22 |
| 4,951,099 | 8/1990 | Berenz et al. | 357/22 |

FOREIGN PATENT DOCUMENTS

| | | | |
|---|---|---|---|
| 58-79773 | 5/1983 | Japan | 357/22 |
| 62-189760 | 8/1987 | Japan | 357/22 |
| 62-213168 | 9/1987 | Japan | 357/22 |
| 62-252174 | 11/1987 | Japan | 357/22 |
| 62-252175 | 11/1987 | Japan | 357/22 |
| 63-198363 | 8/1988 | Japan | 357/22 |

OTHER PUBLICATIONS

"High Performance Monolithic Power Amplifier Using All RIE Etch Process," Chi et al., 1987 IEEE, GaAs IC Symposium, pp. 159-162.
"GAAs MMIC Evaluation of Via Fracturing," Pavio et al., 1988 IEEE, GaAs IC Symposium, pp. 305-307.

Primary Examiner—Olik Chaudhuri
Assistant Examiner—Long Pham

[57] ABSTRACT

A compound semiconductor device including a field effect transistor particularly suited for high frequency applications such as grounded source applications. An active layer is formed on one surface of a compound semiconductor substrate. An aperture is dry etched through the second surface of the semiconductor substrate toward the first surface, and terminates in the source region of the active layer. The walls of the aperture are metallized as is the second surface of the substrate. A gate electrode and at least a drain electrode are formed on the first surface. The metallized second surface can act as a source electrode by virtue of ohmic contact between the metallized walls of the aperture and the source region of the active layer.

11 Claims, 4 Drawing Sheets

FIG 5.a

COMPOUND SEMICONDUCTOR DEVICE AND METHOD FOR FABRICATION THEREOF

This is a divisional of copending application Ser. No. 623,202, filed on Dec. 6, 1990, now abandoned.

FIELD OF THE INVENTION

This invention relates to semiconductor devices, and particularly to compound semiconductors capable of operating at high frequencies.

BACKGROUND OF THE INVENTION

The present invention is particularly useful in connection with compound semiconductor devices which include, as a circuit element, a field effect transistor adapted for high frequency operation. The semiconductor device is called compound in the sense that it is based on a compound semiconductor material, such as GaAs, capable of high frequency operation. Typically, the device includes multiple circuit components, and the present invention focuses on the structure of the field effect transistor.

In order to provide extremely high frequency operation, and particularly the field effect transistor component when it is used in a grounded source circuit, the source electrode of the field effect transistor must be connected to the ground plane by way of a conductor whose length is as short as possible in order to reduce grounding inductance. The ground plane is usually configured as one surface (usually the rear surface) of the substrate, plated to provide a conductive plane for bonding to the package carrying the semiconductor. In order to minimize the length of the wiring lead from the field effect transistor source to the ground plane, it has been conventional to utilize a via hole formed in the semiconductor substrate, which provides a direct connection through the substrate from the source electrode (carried on the top surface) to the ground plane (carried on the bottom surface).

FIG. 7 illustrates a prior art approach to providing a source grounded field effect transistor (sometimes referred to as a FET). The FET is formed on a compound semiconductor substrate 1, such as GaAs, having an active layer 2 on the surface thereof. Typically, the active layer 2 is formed by ion implantation, although it can be formed by epitaxial growth when desired The characterization of the active layer as "on" the surface of the substrate is intended to encompass two conditions—a first where ion implantation deposits dopant impurities into the upper structure of the substrate, and a second where a doped layer is grown over the substrate surface. Both structures associate a doped active layer with the surface, and it is unimportant to the present invention whether the active layer is actually formed within the surface of the substrate or carried by the surface—both are considered to be "on the surface" for purposes of understanding the present invention.

As is conventional, the active layer is configured to have a source region 4a, a drain region 5a, and a gate region 3a separating the source and drain regions. A source electrode 4 and drain electrode 5 are in ohmic contact with source and drain regions. A gate electrode 3, in the example formed in a gate recess 3b, forms a Schottky barrier with the active layer 2 to control current flow between the source and drain regions. The structure of the FET thus far described is conventional.

In order to enhance high frequency operation, it is desired to connect the source electrode 4 to a ground plane on the rear surface 1a of the semiconductor substrate 1. To that end, a via hole 6 is formed in the substrate, and metallization 7 is deposited on the walls of the via as well as on the rear surface 1a of the substrate. Thus, when the semiconductor substrate is mounted on a package 8 (FIG. 8) with the rear surface 1a bonded by means of solder 9 to the package 8, the metallization 7 provides a ground connection, as well as a ground plane, for the grounded source field effect transistor.

Fabrication of the device of FIG. 7 presents a number of difficulties, among them being the ability to reliably form the via 6 without damaging the structure of the field effect transistor. More particularly, the via 6 is etched from the rear surface of the substrate, and etching proceeds until the via reaches the source electrode 4. In many cases, the source electrode 4 serves as an etchant stop. Because the substrate is relatively thick, on the order of 30 to 100 microns (and often as much as 200 microns), a rapid etching process must be used. To that end, wet etching, often using tartaric acid, is utilized. The wet etching process typically does not lend itself to adequately precise control to terminate etching immediately upon reaching the active layer 2, which is usually on the order of 1 micron in thickness. Thus, the source electrode 4 is usually utilized as an etchant stop. As a result, when the semiconductor chip is assembled into a package, the solder 9 which is used to bond the rear surface of the substrate to the package, not only fills the via 6 as intended, but actually contacts and heats the source electrode 4. Since the source electrode 4 is relatively thin (typically one micron or less) and is of a low melting point material, the source electrode 4 will often melt under these conditions, resulting in a structure such as shown in FIG. 8 where the source electrode 4 is partly destroyed, and solder 9, having destroyed the electrode 4 overflows to the upper surface of the substrate, destroying the field effect transistor.

Thus, the structure of FIGS. 7 and 8 presents problems in the assembly of the fabricated semiconductor substrate 1 onto the package 8. In addition, it does not adequately lend itself to miniaturization in that the source and drain regions are typically of reasonably large area, and the associated electrodes are about of the same size and shape as the source and drain regions. As a result, a reasonably large area on the surface is taken up with the various electrodes, even though the source electrode 4 has its main connection to the ground plane at the rear of the substrate. The presence of the source electrode 4 is necessary, however, when using the wet etching technique described above, in order to serve as an etchant stop.

SUMMARY OF THE INVENTION

In view of the foregoing, it is a general aim of the present invention to provide a compound semiconductor device with a high frequency field effect transistor in which the electrical connection from the source or drain region to the back plane is accomplished more reliably than using the wet etching process, and without danger of melting the source electrode during the package fabrication operation.

In accomplishing that aim, it is an object of the present invention to provide a fabrication technique for use with a source grounded FET in which the ground connection is formed by way of a via, but in which a surface electrode for the source plays no part in the formation or plating of the via.

According to a specific implementation of the invention, an object is to further miniaturize a FET by eliminating the need for a source electrode on the upper surface of the substrate which carries the FET.

In accordance with a further aspect of the invention, an object is to produce a field effect transistor in which the source region is connected to a conductive plane on the rear of the semiconductor substrate by way of a via, in such a way that the via is formed reliably to a depth adequate for ohmic contact with the source region, but without danger of solder overflow onto the substrate surface.

In accordance with the invention, there is provided a compound semiconductor device formed on a compound semiconductor substrate having first and second opposed surfaces. The compound semiconductor device has a field effect transistor formed on the first surface thereof. The field effect transistor has an active layer which includes source and drain regions separated by a gate. An aperture is formed in the second surface of the substrate and penetrates the substrate to reach the active layer. The aperture, however, terminates short of the first surface of the substrate. A conductive metal layer is formed in the aperture and covering the walls thereof, and also over the second surface of the substrate. The metal layer is in ohmic contact with the portion of the active layer penetrated by the aperture.

When the FET is used as a source grounded device, the aperture is formed under the source region, is in ohmic contact with the source region, so that the metallic layer on the second surface of the substrate acts as a large area source electrode.

In accordance with the method aspects of the invention, there is provided a method which includes the steps of dry etching an aperture through the second surface of the substrate toward the first surface in such a way that the dry etching is reliably terminated after the aperture reaches the active layer but before the aperture penetrates the first surface of the substrate. The walls of the aperture are then metallized along with the second surface of the substrate to form a large area electrode in contact with the source region of the FET.

It is a feature of the invention that a grounded source FET can be produced without the need for a surface source electrode to serve as an etchant stop. It is a further feature of the invention that the surface source electrode can be dispensed with altogether, freeing the area of the semiconductor substrate which would otherwise be devoted to carrying a source electrode.

Other objects and advantages will become apparent from the following detailed description when taken in conjunction with the drawings, in which:

BRIEF DESCRIPTION OF THE DRAWINGS

FIGS. 5a and 5b illustrate an alternative form of the present invention utilizing an etchant stop layer;

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
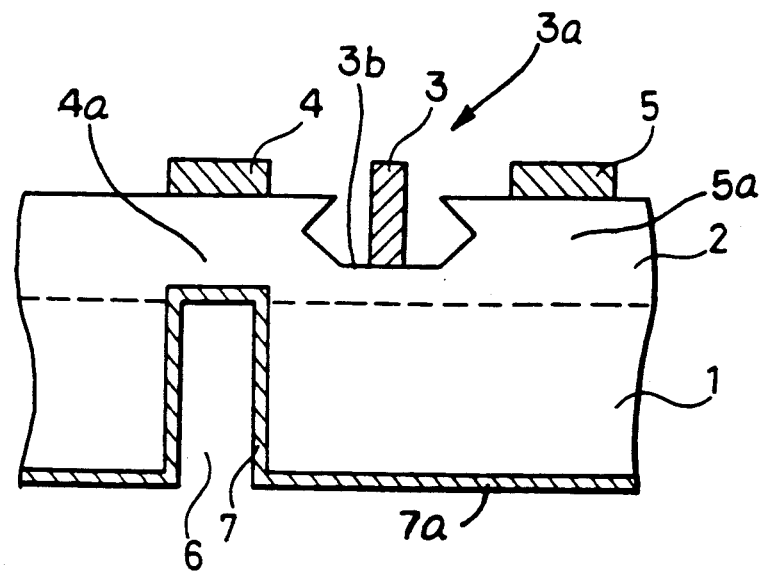
FIG. 1 is a sectional view illustrating a compound semiconductor device including a field effect transistor exemplifying the present invention.

Turning now to the drawings, FIG. 1 shows a first embodiment of a compound semiconductor device having a field effect transistor constructed in accordance with the present invention. The semiconductor device is formed on a compound semiconductor substrate 1 having an upper surface 1b on which an active layer 2 is formed. As noted above, the active layer 2 formed on the surface of the semiconductor device can be in the form of dopant impurities implanted into the surface by means of ion implantation, or dopant impurities deposited on the surface in an epitaxially grown compound semiconductor layer. The active layer is doped to contain a source region 4a and a drain region 5a separated by a gate region 3a. The FIG. 1 implementation uses a recessed gate structure in which a recess 3b is etched in the active layer 2 intermediate the source and drain regions. Source and drain electrodes 4, 5 are formed on the source and drain regions, respectively, and a gate electrode 3 deposited in the gate recess 3b.

In accordance with the invention, a via 6 is formed in the rear surface of the substrate, to penetrate the substrate in a manner which reaches but does not project through the active layer 2. The precision needed for forming the via 6 will be apparent when it is appreciated that the showing of FIG. 1 is not to scale, but that the substrate 1 is typically on the order of 30 to 100 microns thick and often as much as 200 microns thick, while the thickness of the active layer 2 is only about 1 micron.

Figure 8:
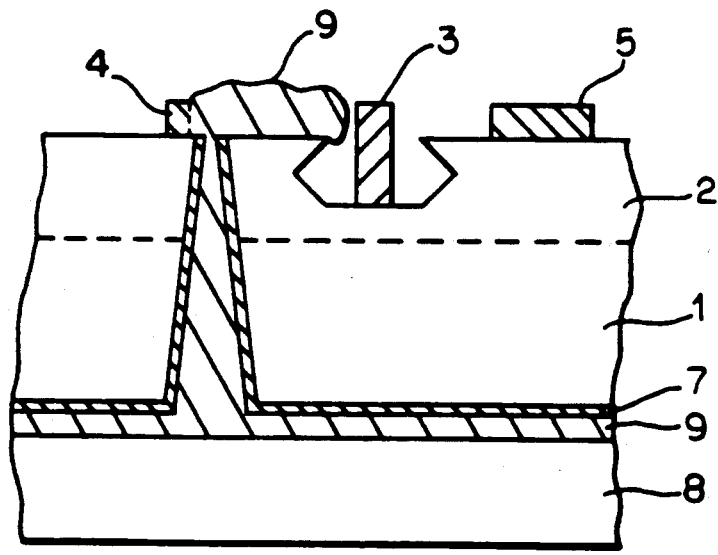
FIG. 8 is a diagram similar to FIG. 7 but illustrating the failure mechanism associated with the device of FIG. 7.

By process techniques to be described below, the via 6 is formed so that it penetrates the major thickness of the substrate 1 and terminates precisely within the active layer 2. When the field effect transistor is intended to be used as a source grounded device, the via 6 is formed to penetrate the active layer and terminate in the source region 4a. Having formed the via, the rear surface and via walls are metallized to form a metallic layer 7. The device is annealed so that the metallic layer 7 is in ohmic contact with the source region 4a. As a result, the large planar area 7a of the metal contact 7 formed on the rear surface of the substrate can serve as a large area source electrode. Thus, when the device of FIG. 1 is bonded to a package (as illustrated in connection with the FIG. 8 prior art) solder can flow to bond the rear surface to the package and to fill the via 6 without danger of affecting the surface electrodes 4, 5 because the upper surface of the substrate remains continuous and unbroken. Thus, the surface source electrode 4 is protected from the molten solder by means of the remaining thickness of the substrate over the via 6 in the active layer 2.

Figure 2:
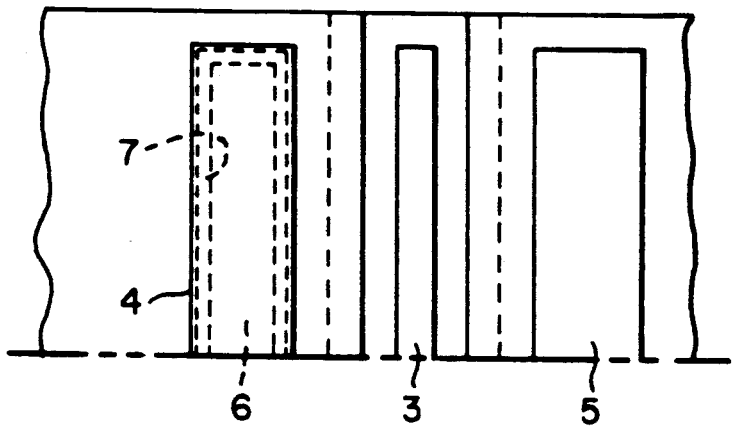
FIG. 2 is a plan view of the device of FIG. 1.
Figure 7:
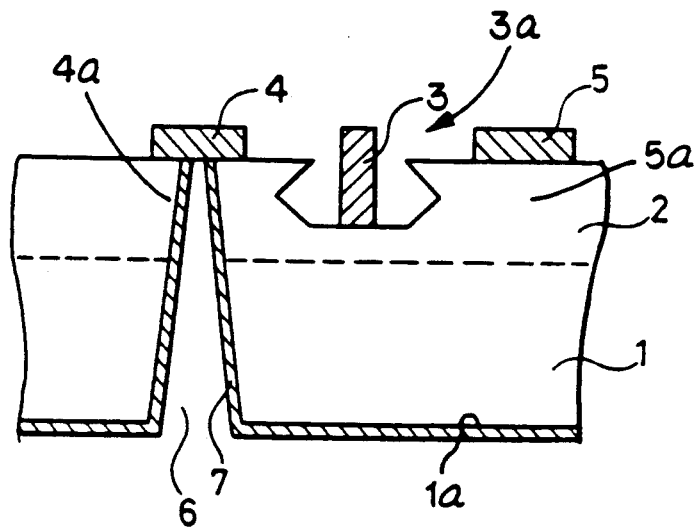
FIG. 7 illustrates a prior art FET utilizing a conventional via for source grounding.

FIG. 2 is a plan view of the semiconductor device of FIG. 1, and illustrates a further advantage of the present invention. Whereas the via connection technique illustrated in FIGS. 7 and 8 typically employs a conventional circular or cylindrical via, in practicing the present invention, the aperture which provides the means for making ohmic contact with the active layer is formed in the same general shape as the source region, with which contact is to be made. Thus, FIG. 2 illustrates a conventional electrode geometry in which the gate 3 is an elongate member having a substantial length running parallel to and intermediate the source and drain regions. In that configuration, the source electrode 4 and drain electrode 5 are rather large rectangular members having a substantial length generally as long as the gate length, and having a width generally commensurate with the width of the source or drain region which the electrode overlies. Typical dimensions for the source electrode are 70 microns in length by about 10 microns in width.

In accordance with the invention, the aperture 6 is configured to have a size, shape and area generally commensurate with that of the region which it underlies, in the illustrated embodiment the source region. Thus, aperture 6 is illustrated as having a rectangular shape, with a length about equal to the length of the gate 3 and a width about equal to the source region width which in turn is about equal to the width of the surface source electrode 4. For the example given, the via will thus be a rectangle of about 70 by 10 microns. The walls of the rectangular aperture 6 are then plated to form a metal layer which is in ohmic contact with the active portion of the source region exposed in the active layer. The electrical continuity of the metallic layer 7 from the aperture to the lower surface of the substrate thus provides a large area source electrode suitable for grounding on the underside of the substrate.

The illustration of FIG. 2 further emphasizes the need for an etching technique which has adequate speed to remove the substantial volume of material from the large rectangular aperture 6, but which also provides for adequately precise control to etch to a depth of typically 30 to 100 micron with an accuracy adequate to terminate etching after reaching but before penetrating the very thin active layer.

Figure 3:
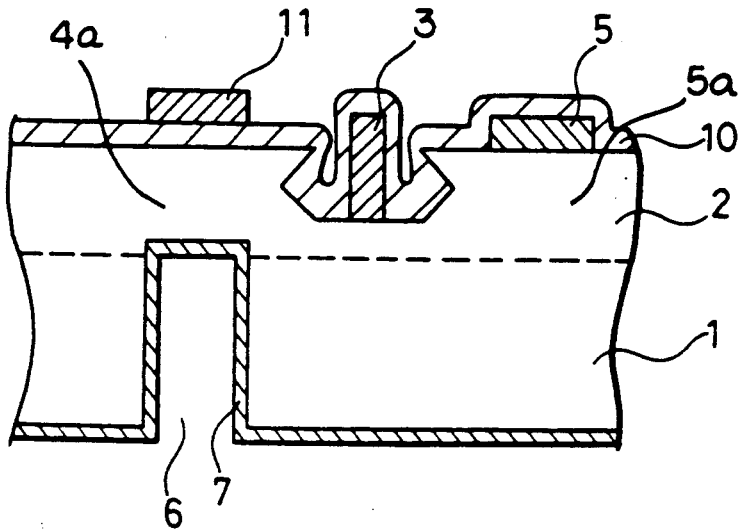
FIG. 3 is a sectional view similar to FIG. 1 but illustrating an alternative form of the invention in which the surface source electrode is eliminated.

Before turning to a more detailed explanation of the manner of accomplishing the etching, attention will first be directed to another embodiment of the present invention and a further advantage which flows from the invention. Such embodiment is shown in FIG. 3 which is similar to the FIG. 1 embodiment except that no provision is made for a source electrode on the front surface of the substrate. It is seen by comparison of FIGS. 1 and 3 that the structure of the two FET's is similar except that the source region 4a of the FIG. 3 embodiment has no surface source electrode 4 as in the FIG. 1 embodiment. Instead, the FIG. 3 embodiment is formed without a surface source electrode, and then an insulating film 10 deposited over the first surface of the substrate as well as over the gate electrode 3 and drain electrode 5. That leaves an insulated layer at the top surface of the semiconductor which provides the opportunity for other uses, such as for forming a metallized interconnection 11 between other elements in the compound semiconductor, and utilizing the surface area of the substrate which would otherwise have been devoted to a source electrode for routing the conductor 11.

Figure 4A:
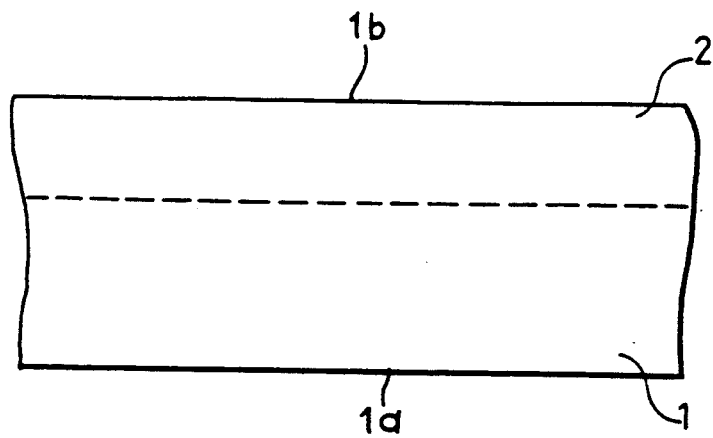
FIGS. 4a–4d are a sequence of sectional views illustrating a fabrication process used to produce an embodiment of the present invention.

The fabrication method for forming a compound semiconductor device in accordance with the present invention is illustrated in FIGS. 4a–4d. FIG. 4a shows a semiconductor substrate formed of a compound semiconductor material, such as GaAs, and having a thickness of 200 microns or less, preferably 30 to 100 microns. An active layer 2 is formed on the upper surface 1b of the substrate 1. In the preferred implementation, the active layer 2 is formed by depositing dopant impurities such as silicon in a concentration of $10^{17}$ to $10^{18}$ ions per cubic centimeter by means of ion implantation. Epitaxial growth of a doped compound semiconductor, such as silicon doped GaAs, can also be utilized to produce the active layer 2 on the upper surface of the substrate 1. As noted above, it is the association of the active layer with the upper surface which is important, rather than whether the active layer is formed by depositing impurities into the surface of the substrate or adding an impurity bearing layer to the substrate surface.

After formation of the active layer 2, the rear surface 1a of the substrate 1 is masked and patterned for formation of the aperture 6. Conventional masking materials, such as nickel, photoresist or other insulating/dielectric layers can be utilized to cover the surface 1a following which an area corresponding to the desired dimensions of the via is opened in the mask. In accordance with the invention, a dry etching process is then initiated to form the aperture 6, and is controlled in such a way that the aperture penetrates the majority of the thickness of the substrate 1 while terminating before penetrating the upper surface 1b, such that the aperture 6 progresses through the substrate 1 and terminates in the thin active layer 2. In accordance with the invention, the via hole 6 is formed by etching the substrate 1 from the back surface utilizing plasma etching. A preferred etchant medium is one which produces chlorine ions that participate in the etching reaction. Examples of such media include elemental chlorine, boron trichloride, silicon tetrachloride, and the like. Plasma etching utilizing such materials proceeds at a rapid but controllable rate such that the mass of material which must be removed from the via 6 as the substrate 1 is being penetrated is readily and efficiently removed. However, the time rate of progression of the etching reaction is very controllable such that by adequate control of time and etching conditions, the etching process can be terminated at the point where the via 6 reaches the active layer 2 but before it penetrates the upper surface 1b of the substrate. It is not necessary to terminate etching precisely at the interface of the active layer 2 and substrate 1. However, it is important that the via 6 actually reach the active layer 2 so that the metallic layer is formed within the via 6 in ohmic contact with the active layer. The ohmic contact thereby allows the metallization (which includes the metallization on the lower surface of the electrode) to serve as an electrical contact for the FET region in question, usually the source region.

Figure 4B:
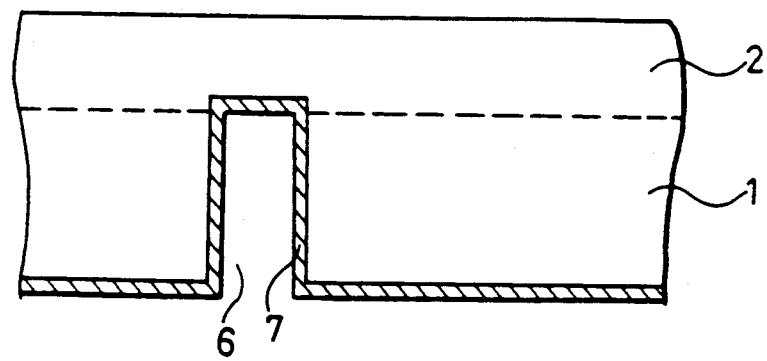

FIG. 4b illustrates the via 6 having been formed through the substrate to terminate in the active layer 2, following which a metal layer 7 is deposited on the walls of the via and on the rear surface 1a of the substrate 1. The metallic layer is a conventionally available electrode material such as an AuGe alloy or AuGe/Ni/Au alloy capable of forming ohmic contact with the active layer 2. The metal layer 7 is preferably deposited by conventional sputtering or plating techniques to form a continuous layer as illustrated in FIG. 4b.

Figure 4C:
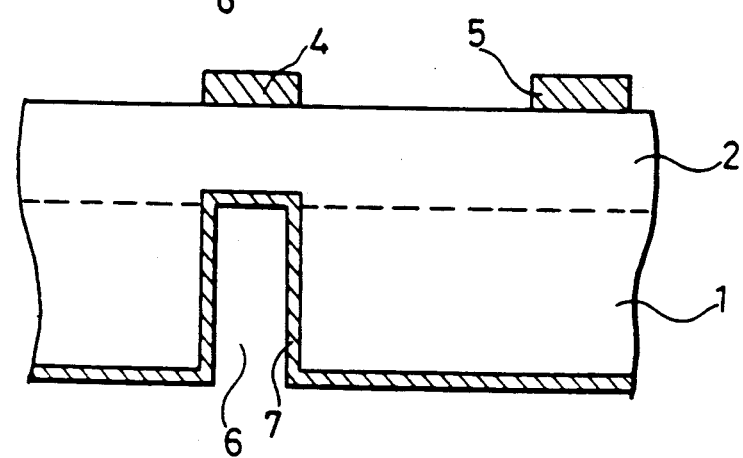

Having formed the metallic layer 7 on the rear surface 1a and in the via 6, surface electrodes 5 (and 4 if present) are deposited on the upper surface 1b of the substrate in an conventional fashion, such as by conventional photolithographic or lift-off techniques. The device is then heat treated, such as at a temperature of about 400° C. for about 3 minutes to produce an ohmic contact between the surface electrodes and the regions they overlie, as well as between the metal layer 7 and the source region in the active layer 2. The result of the process to that stage is illustrated in FIG. 4c.

Processing then continues to form the gate structure for the FET by etching a gate recess, using standard photolithographic and etching techniques, followed by deposition of a gate electrode 3. The completed FET is illustrated in FIG. 4d.

Figure 4D:
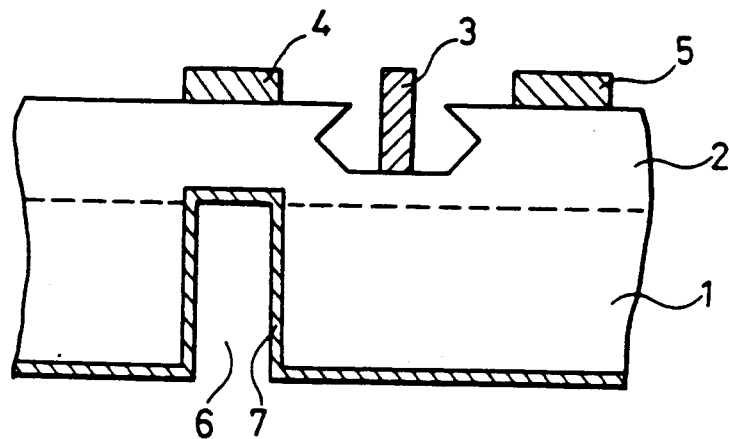

A number of advantages of the invention will be apparent upon an examination of FIG. 4d. First of all, since the via hole 6 is formed from the rear surface 1a of the substrate, and is performed by means of a highly controllable dry etching process, the via 6 terminates before penetrating the upper surface 1b of the substrate. Thus, there is no danger of damaging the surface source electrode 4 in the packaging operation, as had been illustrated in connection with FIG. 8.

In addition, since the conductive alloy, such as AuGe, deposited to form the layer 7 forms an ohmic contact with the active layer 2 in the source region, and since the metallic layer 7 is continuous from within the via to the rear surface 1a of the substrate, the planar portion of the metallic layer 7 which covers the rear surface 1b of the substrate can be used as a large area source electrode. The very short via connection between the active layer and the back surface ground plane provides for enhanced high frequency operation. In addition, the structure allows the elimination of the upper surface source electrode 4 with the advantages described previously in connection with FIG. 2.

Figure 5B:
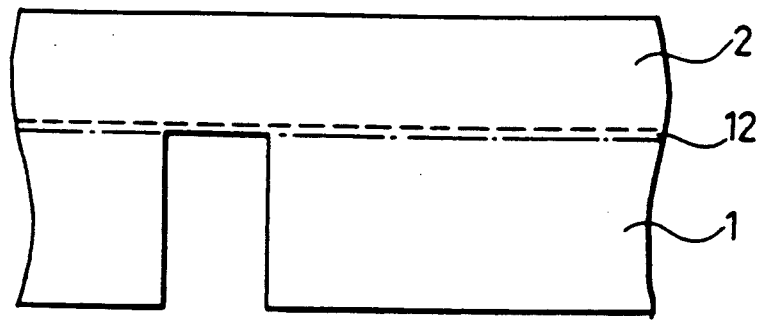

FIGS. 5a and 5b illustrate a further embodiment of the present invention which utilizes a further mechanism in addition to time and etching conditions for controlling the formation of the via 6. In the FIG. 5 embodiment, an intermediate layer 12 is formed on the surface of the substrate 1 intermediate the upper surface 1b and the active layer 2. The intermediate layer is a compound semiconductor layer containing an aluminum component. When the substrate 1 is GaAs, the layer 12 is preferably AlGaAs or AlAs. The thin layer 12 is deposited by conventional epitaxial growth techniques over the upper surface of the substrate 1. The layer 12 is preferably of a thickness between 100 and 1000 Å, and the preferred method of epitaxial growth is molecular beam epitaxy (MBE). Following growth of the layer 12, the active layer 2 is then deposited by epitaxial growth techniques. The preferred material for the active layer 2 is GaAs doped with impurities such as silicon in a concentration of $10^{17}$ to $10^{18}$ ions per cubic centimeter. Following growth of the active layer 2, the rear surface of the device is patterned as in the prior embodiment and etched to form a via 6.

In the practice of this embodiment of the invention, a small amount of oxygen (1% of less) is mixed with the chlorine series gas. It is known that the etching rate of the compound semiconductor decreases significantly when the material contains an aluminum component Thus, etching of the via 6 proceeds at a relatively rapid rate for so long as the substrate 1 is being etched. However, utilizing the chlorine series etchant gas with a small proportion of oxygen, when the via 6 reaches the level of the intermediate layer 12, the etching rate reduces to about 1/100 or less of its prior rate. Thus, the intermediate layer 12 functions as an etchant stop. The sharp reduction in etching speed provides a further control on terminating the etching process after the bulk of the substrate 1 is penetrated so that the via 6 reaches the active layer 2 but before the via 6 penetrates the active layer 2 to the upper surface of the substrate.

FIG. 5b shows the partially completed device after formation of the source and drain electrodes 4, 5 but before formation of the gate recess, if any, and deposition of the gate. It will be appreciated that additional process steps as described in connection with the previous embodiments are applied to the device of FIG. 5b to form a completed FET.

Figure 6:
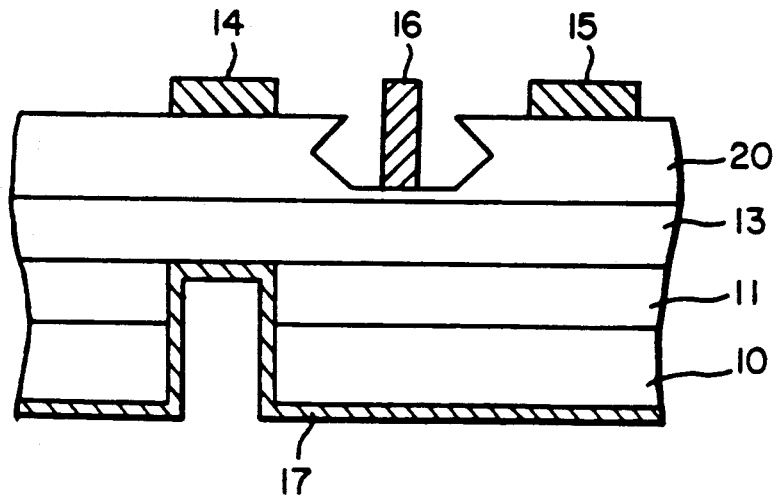
FIG. 6 is a sectional view illustrating yet another embodiment of the invention applied to an HEMT.

FIG. 6 illustrates yet a further application of the invention to an FET like device, in this case an HEMT (high electron mobility transistor). Such transistor is formed on a compound semiconductor substrate 10, preferably GaAs, on which is grown by epitaxial techniques an undoped GaAs layer 11. Molecular beam epitaxy is preferably used for growing the layer 11, although chemical vapor deposition (MOCVD) can also be used in appropriate circumstances. The purpose of layer 11 is to form an undoped channel of lower band gap material than a carrier donor layer, to receive free electrons from ionized donors in the carrier donor layer. A carrier donor layer 13 is formed by epitaxial growth over the layer 11. The layer 13 is a doped higher band gap material, such as silicon doped AlGaAs. The purpose of the layer 13 is to contribute carriers to the channel layer 11 for conduction between source and drain region under the control of potentials applied to a gate. An n-type GaAs cap layer 20 is produced on the layer 13 to prevent surface oxidation of the layer 13. A source electrode 14 and a drain electrode 15 are produced on the layer 20 and a gate electrode 16 is produced on the recess aperture of the layer 20 by techniques known to the art.

Figure 5B:
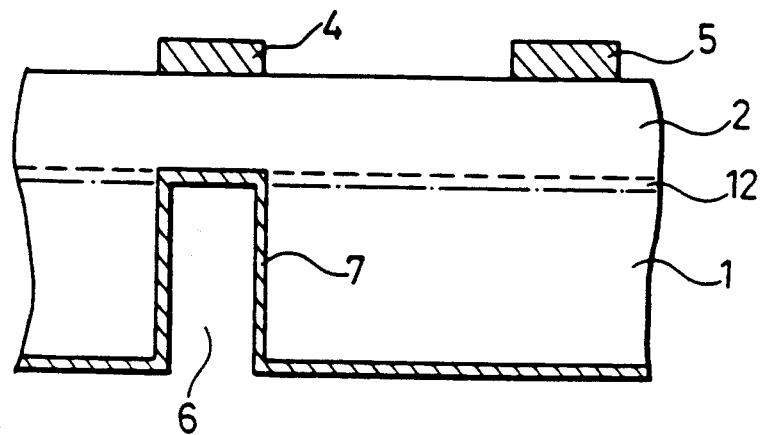

Prior to formation of the surface electrodes, however, a via 16 is formed in the lower surface of substrate 10 to penetrate the substrate and to reach the active layer but stop short of the upper surface of the substrate 10. In this case, the active layer is considered to be the combination of the undoped channel layer 11 and donor layer 13. In the preferred practice of the invention, since the donor layer 13 is a compound semiconductor material carrying an aluminum component, the techniques described in connection with FIG. 5 are utilized to etch the via 16 through the substrate and utilize the layer 13 as an etchant stop. Thus, the via 16 terminates at the rear surface of the doped layer 13 such that when a metallic layer 17 is deposited within the via and on the rear surface of the substrate 10, and subsequently annealed, an ohmic contact is formed between the metallic layer 17 and the doped portion of the active layer 13. The advantages of the invention described in connection with prior embodiments will also be seen to apply to the HEMT implementation shown in FIG. 6. FIG. 6 furthermore illustrates that the benefits of the invention are applicable to semiconductor structures of various configurations, and particularly to those like the illustrated FET like devices which must be optimized to provide excellent high frequency response.

In the foregoing embodiments, a fabrication technique was described in which the via hole 6 is formed from the rear surface of the substrate 1 prior to formation of the source, drain and gate electrodes on the upper surface of the substrate. However, it will be apparent to those skilled in the art that the present invention in its broadest aspects is not limited to that sequence, and the via hole 6 may be formed later in the process when desired.

Furthermore, although the present invention has been described primarily in connection with recessed gate type FET's, it will be apparent that the invention is applicable to other refractory metal gate type FET structures.

It will thus be appreciated that what has been provided is an improved method for fabrication of and an improved compound semiconductor device in which the FET structure of the device is particularly suited to high frequency operation, but can be manufactured reliably. A large area via 6 is reliably etched from the rear surface of the compound semiconductor substrate in a manner which does not penetrate the upper surface, such that bonding of the semiconductor to the package can be accomplished without endangering the components formed on the upper substrate surface. Dry etching techniques are disclosed to reliably form the via 6 in a rapid but controllable manner to achieve the desired result. Since the via 6 terminates in the active layer of the FET, the metallization deposited in the via and on the rear surface is annealed to provide ohmic contact between the rear surface electrode and the active region. Thus, in particular circumstances, for example, when the via is formed under the source region, the surface source electrode can be dispensed with, allowing further miniaturization of the devices.

What is claimed is:

1. A method of producing a compound semiconductor device on a compound semiconductor substrate having first and second opposed surfaces, the method comprising the steps of:
    forming an active layer on the first surface of the semiconductor substrate,
    forming source and drain regions in the active layer on opposite sides of and separated by a gate region,
    dry etching an aperture through the second surface of the substrate toward the first surface, controlling the dry etching step to terminate the etching when the aperture reaches the active layer but before the aperture penetrates the first surface,
    metallizing the walls of the aperture and the second surface of the substrate, forming an ohmic contact between the metallization and the active layer in the source region, said ohmic contact being the only ohmic contact with the source region so that the metallization on the second surface serves as the only source electrode,
    forming a drain electrode on the first surface over the active layer in the drain region, and
    forming a recess in the gate region, and forming a gate electrode in the recess.

2. The method as set forth in claim 1 in which the step of forming source and drain regions comprises forming rectangular regions separated by an elongate gate region, and the step of dry etching comprises etching a rectangular aperture corresponding in size and shape to one of said source or drain regions.

3. The method as set forth in claim 1 further comprising the steps of:
    forming an intermediate layer of a compound semiconductor containing an aluminum component on the first surface of the semiconductor substrate intermediate the substrate and the active layer, and
    utilizing the intermediate layer as an etching stop for the dry etching step to terminate the dry etching step as the aperture reaches the active layer.

4. The method as set forth in claim 3 wherein the dry etching step includes plasma etching using a chlorine series gas mixed with oxygen.

5. The method as set forth in claim 4 wherein the proportion of oxygen in the chlorine series gas is adequate to substantially reduce the dry etching rate when the aperture reaches the intermediate layer.

6. The method as set forth in claim 5 wherein the chlorine series gas comprises elemental chlorine, boron trichloride and silicon tetrachloride.

7. The method as set forth in claim 1 wherein the step of forming the active layer comprises ion implantation of impurities into the substrate.

8. The method as set forth in claim 1 wherein the step of forming the active layer comprises epitaxially growing the active layer over the substrate.

9. The method as set forth in claim 3 wherein the step of forming the intermediate layer comprises epitaxially growing an aluminum containing semiconductor layer over the substrate, and wherein the step of forming the active layer comprises epitaxially growing the active layer over the intermediate layer.

10. The method as set forth in claim 9 wherein the compound semiconductor substrate and the active layer comprise GaAs, and the intermediate semiconductor layer comprises AlGaAs or AlAs.

11. The method as set forth in claim 1 wherein the dry etching step includes plasma etching using a chlorine series gas, and controlling the etching conditions to cause the aperture to reach but not penetrate the active layer.

* * * * *